United States Patent
Loibl

(10) Patent No.: US 6,183,290 B1
(45) Date of Patent: Feb. 6, 2001

(54) ELECTRICAL CONNECTION CONFIGURATION

(75) Inventor: Josef Loibl, Regen (DE)

(73) Assignee: Siemens Aktiengesellschaft, Munich (DE)

(*) Notice: Under 35 U.S.C. 154(b), the term of this patent shall be extended for 0 days.

(21) Appl. No.: 09/356,957

(22) Filed: Jul. 19, 1999

Related U.S. Application Data

(63) Continuation of application No. PCT/DE98/02883, filed on Sep. 29, 1998.

(30) Foreign Application Priority Data

Nov. 18, 1997 (DE) .............................. 197 51 095

(51) Int. Cl.⁷ .................................................. H01R 12/24
(52) U.S. Cl. .......................... 439/492; 439/495; 439/67
(58) Field of Search .................... 439/492, 67; 361/748, 361/749

(56) References Cited

U.S. PATENT DOCUMENTS

| | | | |
|---|---|---|---|
| 3,149,896 | * 9/1964 | Hall | 439/329 |
| 4,023,879 | * 5/1977 | Braund et al. | 439/76.1 |
| 4,647,125 | * 3/1987 | Landi et al. | 439/67 |
| 4,828,512 | * 5/1989 | McCormick et al. | 439/495 |
| 5,040,853 | 8/1991 | Burgdorf et al. | 303/119 |
| 5,382,829 | * 1/1995 | Inoue | 257/659 |
| 5,608,434 | * 3/1997 | Wilson et al. | 347/50 |

FOREIGN PATENT DOCUMENTS

0375271A2 6/1990 (EP) .............................. H01R/13/52

OTHER PUBLICATIONS

"Improving High Speed Interconnects With Flexible Fluoropolymer Laminates", A. Abramson et al., 8307 Electronic Packaging & Production, Jul. 1991, No. 7, Newton, Mass.

\* cited by examiner

Primary Examiner—Brian Sircus
Assistant Examiner—Michael C. Zarroli
(74) Attorney, Agent, or Firm—Herbert L. Lerner; Laurence A. Greenberg; Werner H. Stemer

(57) ABSTRACT

An electrical connection configuration includes an electrical connection element for electrically connecting an electrical assembly accommodated in a housing to an electrical peripheral system disposed outside the housing. The electrical connection element is a flat, flexible conductor-track carrier having electrical conductor tracks integrated therein and is guided into the housing in the vicinity of a housing seal between two housing parts.

9 Claims, 4 Drawing Sheets

ELECTRICAL CONNECTION CONFIGURATION

CROSS-REFERENCE TO RELATED APPLICATION

This application is a continuation of copending International Application No. PCT/DE98/02883, filed Sep. 29, 1998, which designated the United States.

BACKGROUND OF THE INVENTION

Field of the Invention

The invention relates to an electrical connection configuration including an electrical connection element for connecting an electrical assembly accommodated in a housing, in particular a transmission housing of a motor vehicle, to an electrical peripheral system disposed outside the housing.

In motor vehicle technology, it is often necessary to establish electrical connections to components which are accommodated in a sealed housing. By way of example, in the case of electronically controlled automatic transmissions of passenger cars, a sensor system present in the transmission housing as well as mechanical actuating elements present therein have to be connected to an electrical peripheral system disposed outside the transmission housing. That makes it necessary to lead voltage supply lines, as well as control signal lines in the case of a transmission control unit disposed outside the transmission housing, through a transmission wall into an interior of the transmission. For that purpose, use is made of special transmission connectors which are inserted into holes in the transmission wall. Those connectors have a comparatively complicated configuration since it is necessary for both the connection between the hole and the outer side of the connector and the contact pin fittings integrated in the connector, to be oil-tight.

For some time there has been a trend toward relocating the control electronics for the automatic transmission to a greater and greater extent in the interior of the transmission. In that case, it is no longer necessary to pass the signals supplied by the sensor system of the transmission out of the interior of the transmission. However, an electrical lead-through from the outside into the interior of the transmission cannot be dispensed with in such a structure either. In the case of such "on site" electronics, the problem additionally arises that the control electronics have to be accommodated in their own control-unit housing so that they are protected against the extremely aggressive additives which are added to the transmission oils. That necessitates further electrical bushings, which are generally constructed in the form of oil-tight plug connections on the control-unit housing.

European Patent 0 513 263 B1 describes a fuel injection pump in which electrical conductors in the form of conductor tracks applied on a flexible conductor sheet are guided through a sealing gap between a housing and a housing cover into the interior of the housing. That document relates neither to a transmission housing nor to the case where a plurality of electrical components are present in the housing. Furthermore, the control electronics which are used for the fuel injection pump described in that document are situated outside the sealed housing region.

SUMMARY OF THE INVENTION

It is accordingly an object of the invention to provide a simple and cost-effective configuration for the electrical connection of an assembly having a plurality of electrical components within a sealed housing, in particular a transmission housing, to an electrical peripheral system outside the housing, which overcomes the hereinafore-mentioned disadvantages of the heretofore-known devices of this general type.

With the foregoing and other objects in view there is provided, in accordance with the invention, an electrical connection configuration, comprising a housing, in particular a motor vehicle transmission housing, having at least two housing parts and a housing seal tightly coupling the housing parts to one another; an electrical assembly accommodated in the housing and having a plurality of electrical components; and an electrical connection element for connecting the electrical assembly to an electrical peripheral system outside the housing, the electrical connection element having a flat, flexible conductor-track carrier formed of an electrically insulating material and electrical conductor tracks integrated in the conductor-track carrier, the electrical connection element guided through in the vicinity of the housing seal between the housing parts, and the electrical connection element having end sections leading to individual components of the electrical peripheral system electrically contact-connected to the conductor tracks at the end sections.

By virtue of the dual function of the electrical connection element, namely of establishing the electrical connection to the electrical peripheral system in the external region of the housing on one hand, and of jointly making contact with a plurality of components present in the housing on the other hand, a highly cost-effective overall structure of the electrical connection configuration is obtained. The sealing gap lead-through or bushing provides a simple and effective possibility of electrical connection from the outside, which makes it possible to omit the expensive housing connector used heretofore. At the same time, it is possible to retain the seals used heretofore, and the construction of the electrical connection elements as a flat conductor-track carrier means that it is not necessary to take any additional measures for sealing. Furthermore, the line routing in the transmission housing to the individual electrical components is considerably simplified since a plurality of the electrical components are contact-connected on one and the same electrical connection element, on end sections thereof which are guided to the component in each case, through the use of the conductor tracks provided there. Consequently, the use of the novel electrical connection element, constructed as a conductor-track carrier with conductor tracks, enables the advantages obtained in the context of the electrical lead-through or bushing into the housing to be combined with advantages in the context of the line routing within the housing.

In accordance with another feature of the invention, one of the electrical components is a control unit which controls other electrical components contained in the housing. Electrical connections inside the housing between the control unit and the controlled components are necessary in this case. The effect achieved in this case by the joint connection, provided in accordance with the invention, of the electrical components and of the control unit to the electrical connection element, is that the electrical supply leads from the outside as well as the interconnections discussed are accommodated in one and the same conductor-track carrier. In addition to the aspect of the comparatively low production costs of such an electrical connection element, the costs incurred during mounting are also reduced due to the simple assembly.

In accordance with a further feature of the invention, the control unit includes at least two control-unit housing parts connected to one another in an oil-tight manner, and the electrical connection element is guided between the control-unit housing parts into the control unit. This obviates the necessity of using a through-connecting housing connector on the control-unit housing.

In accordance with an added feature of the invention, the electrical connection element has a central section which is accommodated in the control unit and is provided with component extensions, which are guided out of the control unit between the control-unit housing parts and, on their end sections, make contact with the electrical components. Such an, as it were, star-shaped structure of the electrical connection element enables particularly effective disentanglement of the line routing to the individual electrical components, which cannot be realized when using a common housing connector with respectively separate supply lead cabling.

In accordance with an additional feature of the invention, the central section of the electrical connection element has a cutout formed therein, and a circuit carrier is disposed in the cutout and contact-connected by the conductor tracks of the connection element in the cutout.

In accordance with yet another feature of the invention, the electrical connection element has an extension adhesively and oil-tightly bonded to at least one of the housing parts where the connection element is guided through the housing.

In accordance with yet a further feature of the invention, the component extensions of the electrical connection element are adhesively and oil-tightly bonded to at least one of the housing parts of the control unit where the component extensions are guided between the housing parts of the control unit.

In accordance with a concomitant feature of the invention, the conductor-track carrier is composed of a flexible conductor-track sheet, which is constructed from a base sheet and a covering sheet, and the conductor tracks are embedded between the base sheet and the covering sheet. Reliable electrical insulation of the conductor tracks with respect to the outside, in particular in the regions of the housing lead-throughs or bushings as well, is achieved as a result.

The provision of adhesive bonding between the conductor-track carrier and the transmission housing part and/or control-unit housing part in the lead-through or bushing region makes it possible to increase the sealing action further and to improve the positional stability of the electrical connection element as well as the positionability thereof during assembly.

Other features which are considered as characteristic for the invention are set forth in the appended claims.

Although the invention is illustrated and described herein as embodied in an electrical connection configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
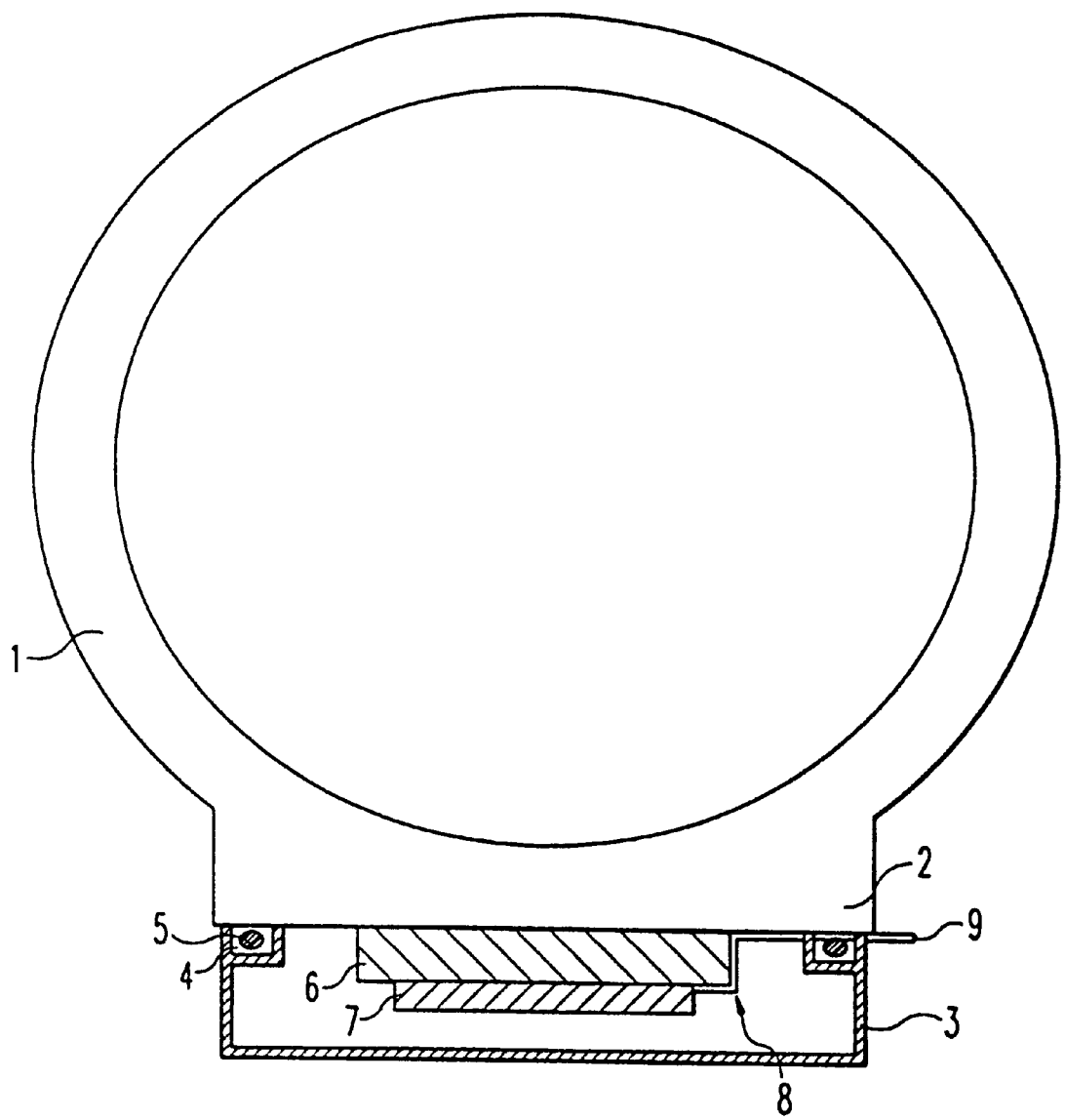
FIG. 1 is a diagrammatic, cross-sectional view of an automatic shift transmission with a transmission control unit accommodated in an oil sump.

Referring now to the figures of the drawings in detail and first, particularly, to FIG. 1 thereof, there is seen an electrically controlled automatic transmission which has a transmission housing 1 provided with a sealing flange 2 in a lower region thereof and an oil sump 3 flanged onto the sealing flange. The oil sump 3 has a peripheral groove 4 in a sealing surface thereof on the flange side and a transmission seal 5 is inserted in the peripheral groove 4. The transmission seal 5 may be acrylate-based.

A hydraulic shift plate 6 that extends in an interior of the oil sump 3 is mechanically connected to the automatic transmission, which is not illustrated in FIG. 1, and an electrical transmission control unit 7 is disposed on an underside of the hydraulic shift plate 6. The control unit 7 is a component of an electrical assembly accommodated in the housing 1, 3 and having a plurality of electrical components. An electrical connection element 8, which is connected to the transmission control unit 7, is guided with an extension 9 between the sealing flange 2 and the transmission seal 5 into an external region of the transmission housing 1.

Figure 2:
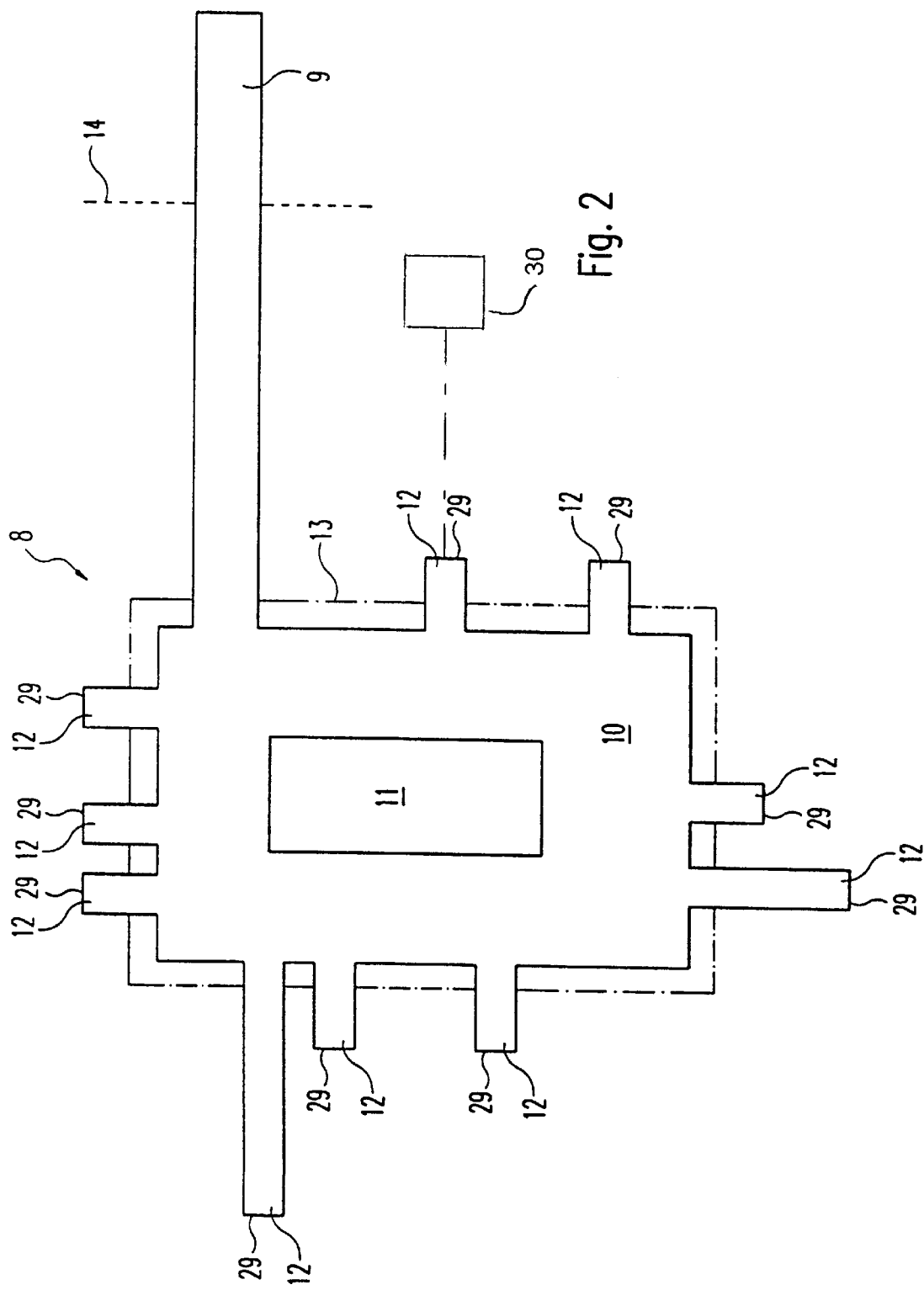
FIG. 2 is a plan view of an electrical connection configuration.

FIG. 2 shows a diagrammatic plan view of the electrical connection element 8 used in FIG. 1 and serves to elucidate the shaping of the connection element. Individual conductor-track paths cannot be discerned in the illustration. The electrical connection element 8 has a central region 10, which is rectangular as seen in the plan view, and in the center of which a cutout 11 is provided. Component extensions 12, running toward the outside and having end sections 29, lead away from the central region 10 and are provided for the purpose of contact-connecting the electrical connection element 8 to individual actuators and sensors in the transmission housing. The end sections 29 lead to individual components of an electrical peripheral system 30 outside the housing 1, 3. The length and shaping of the component extensions 12 depend on the installation position of the control unit as well as the locations of the electrical components with which contact is to be made. Furthermore, the central region 10 is connected to the extension 9 leading toward the outside.

In the installed state, the central region 10 is accommodated entirely in the housing of the transmission control unit 7. A dot-dash line 13 reproduces the course of a housing sealing gap through which the extensions 9 and 12 are guided out of the housing. A dashed line 14 indicates a position at which the extension 9 leaves the interior of the transmission.

Figure 3:
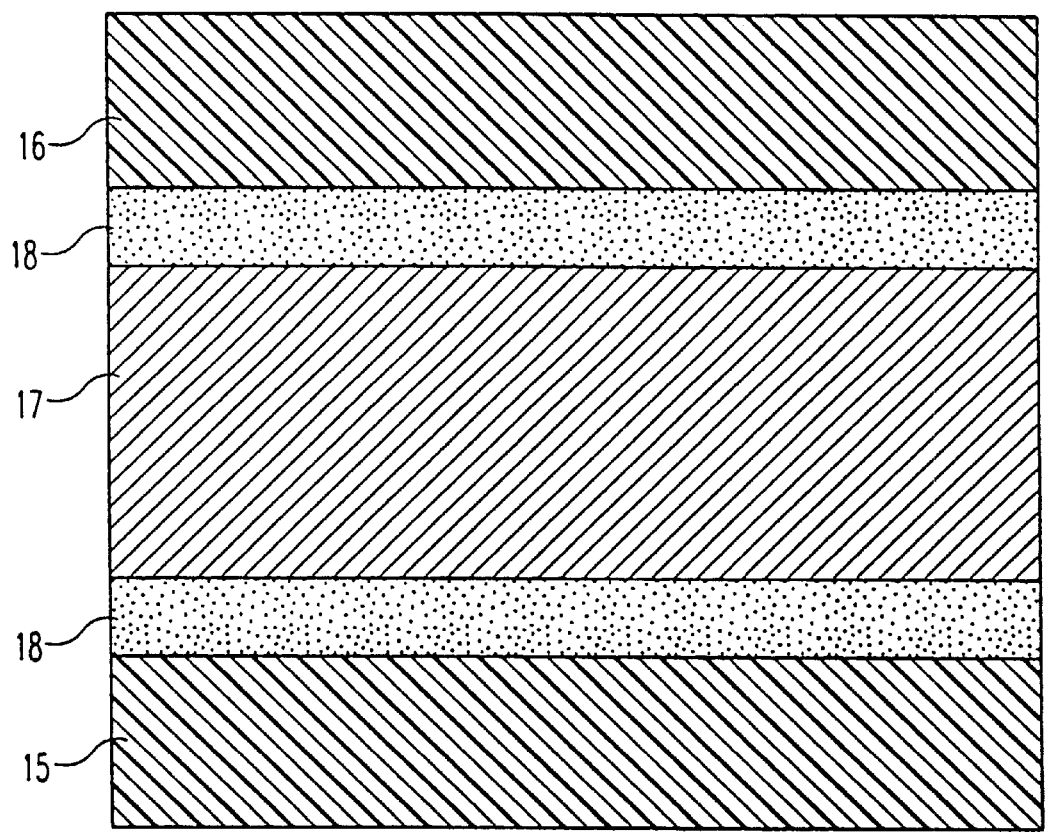
FIG. 3 is a sectional view of a conductor-track carrier in the direction of an electrical conductor track running therein.

FIG. 3 is a longitudinal section showing the structure of the electrical connection element 8 with regard to the course of a conductor track. A lower base sheet 15 and an upper covering sheet 16 are formed of polyimide and surround a conductor track 17, which is embedded in an adhesive layer 18. The effect of this structure is that the conductor tracks 17 are guided in the electrical connection element 8 in such a way that they are electrically insulated from one another and with respect to the outside. The base sheet 15 and the covering sheet 16 form a conductor-track carrier. The individual components of the electrical peripheral system 30 are electrically contact-connected to the conductor tracks 17 at the end sections 29.

Figure 4:
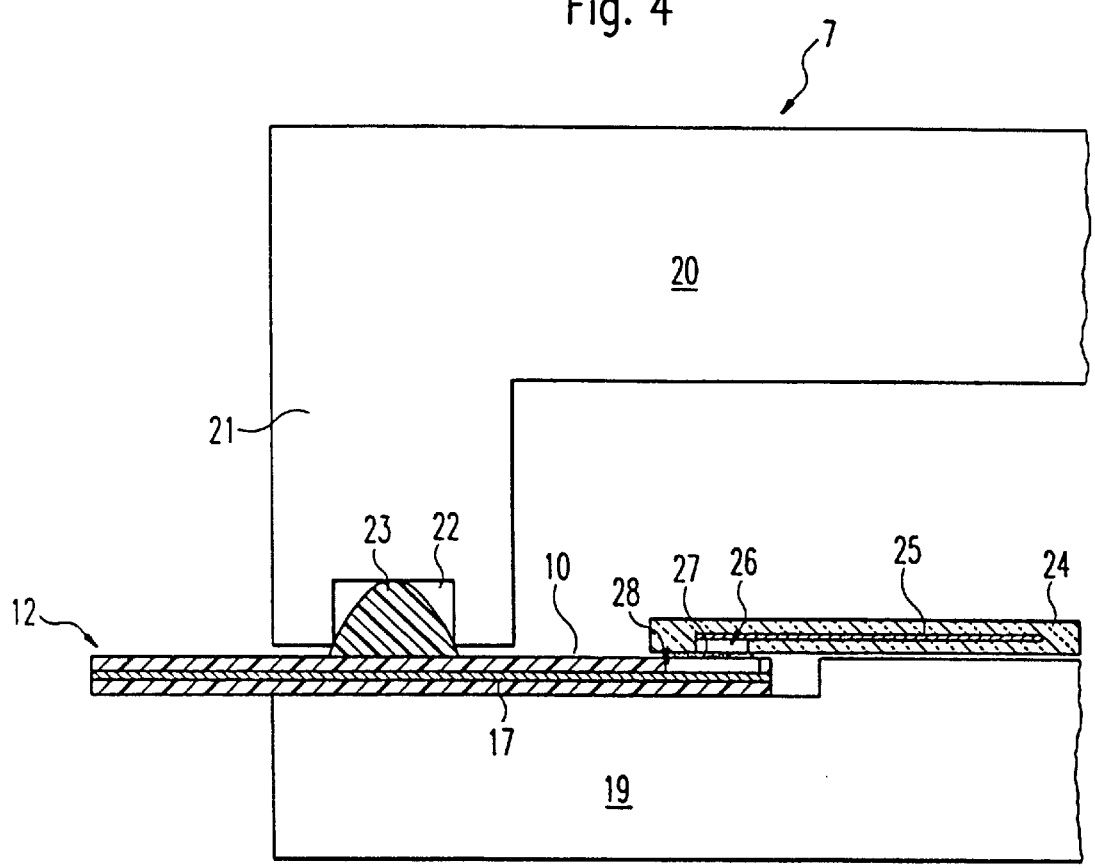
FIG. 4 is a fragmentary, sectional view of a housing of a transmission control unit with an electrical connection configuration entering in a sealing region.

FIG. 4 shows a bushing of a component extension 12 which is constructed in accordance with FIG. 3 and passes through the housing of the transmission control unit 7. The housing includes a metallic base plate 19 and a housing attachment 20, on which a peripheral housing wall 21 is constructed. The component extension 12 runs through a sealing gap between the housing wall 21 and the base plate 19 and is adhesively bonded onto the base plate 19 using an oil-resistant adhesive in this region. A peripheral sealing groove 22, in which an oil-resistant sealing ring 23 engages, is situated in an end region of the housing wall 21. The sealing ring 23 may be pressed or vulcanized onto the component extension 12 and seals the component extension 12 with respect to the housing wall 21. The sealing groove 22 and the sealing ring 23 are optional, that is to say that the end surface of the housing wall 21 on the base plate side may also be constructed as a planar sealing surface. In that case the sealing is brought about simply through the use of a sufficient contact pressure exerted on the conductor-track carrier 15, 16. Furthermore, sealing can also be effected or improved by the use of additional sealing elements and it is likewise possible for the central region 10 of the electrical connection element 8 to span the sealing region of the transmission control-unit housing on all sides and thus to contribute to the sealing of the housing.

Furthermore, FIG. 4 illustrates a ceramic substrate (LTCC) 24 which serves as a circuit carrier and has conductor tracks 25. The conductor tracks 25 of the ceramic substrate 24 are electrically connected to the conductor tracks 17 of the electrical connection element 8 through contact points 26. The contact points 26 are formed through the use of an electrically conductive contact adhesive 27 on an exposed contact pad 28 above a conductor track 17.

The extension 9 is led through between the transmission housing parts in a similar manner to that described in the description of FIG. 4 with regard to the component extension 12 and the housing parts 19, 21 of the control unit 7. In this case too, the tightness can be improved by oil-tight adhesive bonding of the extension 9 onto the transmission housing flange 2. The use of further sealing elements in addition to the housing seal 5 that was already discussed with regard to FIG. 1 may likewise be provided, if required.

I claim:

1. An electrical connection configuration, comprising:
   a housing having at least two housing parts and a housing seal tightly coupling said housing parts to one another;
   an electrical assembly accommodated in said housing and having a plurality of electrical components, one of said electrical components being a control unit controlling others of said electrical components contained in said housing, said control unit having a control-unit housing with at least two housing parts oil-tight connected to one another; and
   an electrical connection element for connecting said electrical assembly to an electrical peripheral system outside said housing, said electrical connection element having a flat, flexible conductor-track carrier formed of an electrically insulating material and electrical conductor tracks integrated in said conductor-track carrier, said electrical connection element guided through in the vicinity of said housing seal between said housing parts, said electrical connection element having end sections leading to individual components of the electrical peripheral system electrically contact-connected to said conductor tracks at said end sections, and said electrical connection element guided between said housing parts of said control unit into said control unit.

2. The configuration according to claim 1, wherein said housing is a motor vehicle transmission housing.

3. The configuration according to claim 1, wherein said electrical connection element has a central section accommodated in said control unit, and said electrical connection element has component extensions guided out of said control unit between said control-unit housing parts to said end sections making contact with the individual components of the electrical peripheral system.

4. The configuration according to claim 3, wherein said central section of said electrical connection element has a cutout formed therein, and a circuit carrier is disposed in said cutout and contact-connected by said conductor tracks of said connection element in said cutout.

5. The configuration according to claim 3, wherein said component extensions of said electrical connection element are adhesively and oil-tightly bonded to at least one of said housing parts of said control unit where said component extensions are guided between said housing parts of said control unit.

6. The configuration according to claim 1, wherein said conductor-track carrier is a flexible conductor-track sheet having a base sheet and a covering sheet, and said conductor tracks are embedded between said base sheet and said covering sheet.

7. An electrical connection configuration, comprising:
   a housing having at least two housing parts and a housing seal tightly coupling said housing parts to one another;
   an electrical assembly accommodated in said housing and having a plurality of electrical components; and
   an electrical connection element for connecting said electrical assembly to an electrical peripheral system outside said housing, said electrical connection element having a flat, flexible conductor-track carrier formed of an electrically insulating material and electrical conductor tracks integrated in said conductor-track carrier, said electrical connection element guided through in the vicinity of said housing seal between said housing parts, said electrical connection element having end sections leading to individual components of the electrical peripheral system electrically contact-connected to said conductor tracks at said end sections, and said electrical connection element having an extension adhesively and oil-tight bonded to at least one of said housing parts where said connection element is guided through said housing.

8. The configuration according to claim 7, wherein said housing is a motor vehicle transmission housing.

9. The configuration according to claim 7, wherein said conductor-track carrier is a flexible conductor-track sheet having a base sheet and a covering sheet, and said conductor tracks are embedded between said base sheet and said covering sheet.

* * * * *